United States Patent
Hiroi

(10) Patent No.: US 7,536,667 B2
(45) Date of Patent: May 19, 2009

(54) METHOD OF SEMICONDUCTOR DEVICE AND DESIGN SUPPORTING SYSTEM OF SEMICONDUCTOR DEVICE

(75) Inventor: Masayuki Hiroi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 295 days.

(21) Appl. No.: 11/498,813

(22) Filed: Aug. 4, 2006

(65) Prior Publication Data

US 2007/0033563 A1 Feb. 8, 2007

(30) Foreign Application Priority Data

Aug. 5, 2005 (JP) .............................. 2005-227804

(51) Int. Cl.
G06F 17/50 (2006.01)

(52) U.S. Cl. ............................ 716/13; 716/14; 716/21; 716/5

(58) Field of Classification Search ................... 716/13, 716/14, 21, 5
See application file for complete search history.

(56) References Cited

U.S. PATENT DOCUMENTS

| | | | | |
|---|---|---|---|---|
| 5,644,500 A * | 7/1997 | Miura et al. ................... | 716/8 |
| 5,793,643 A * | 8/1998 | Cai .............................. | 716/12 |
| 6,035,108 A * | 3/2000 | Kikuchi ........................ | 716/2 |
| 6,185,722 B1 * | 2/2001 | Darden et al. .................. | 716/5 |
| 6,202,195 B1 * | 3/2001 | Tanaka et al. ................. | 716/13 |
| 6,226,560 B1 * | 5/2001 | Hama et al. .................... | 700/97 |
| 6,684,377 B2 * | 1/2004 | Barney et al. .................. | 716/10 |
| 6,785,874 B2 * | 8/2004 | Tsukuda ......................... | 716/5 |
| 6,892,372 B2 * | 5/2005 | Deura ........................... | 716/14 |
| 7,010,770 B2 * | 3/2006 | Liang et al. ..................... | 716/13 |
| 7,032,207 B2 * | 4/2006 | Kurose et al. .................. | 716/12 |
| 7,039,890 B2 * | 5/2006 | Takechi et al. ................ | 716/11 |
| 7,065,729 B1 * | 6/2006 | Chapman ....................... | 716/13 |
| 7,117,468 B1 * | 10/2006 | Teig et al. ...................... | 716/11 |
| 7,134,111 B2 * | 11/2006 | Nakamoto ..................... | 716/10 |
| 7,191,415 B2 * | 3/2007 | Kitamura et al. ................ | 716/5 |
| 7,340,710 B1 * | 3/2008 | Hoerold et al. ................ | 716/12 |
| 2002/0108095 A1 * | 8/2002 | Barney et al. .................. | 716/10 |
| 2003/0028853 A1 * | 2/2003 | Deura ........................... | 716/14 |
| 2003/0037308 A1 * | 2/2003 | Tsukuda ....................... | 716/11 |

(Continued)

FOREIGN PATENT DOCUMENTS

JP 2003006261 A * 1/2003

OTHER PUBLICATIONS

Pamunuwa et al., "Maximizing Throughput Over Parallel Wire Structures in the Deep Submicrometer Regime", IEEE Transactions on Very Large Scale Integration (VLSI) Systems, vol. 11, No. 2, Apr. 2003, pp. 224-243.*

(Continued)

Primary Examiner—Phallaka Kik
(74) Attorney, Agent, or Firm—Foley & Lardner LLP

(57) ABSTRACT

A designing method of a semiconductor device is achieved by setting interconnection reference data indicating permissible interconnection widths which are discrete, and a permissible interval between adjacent two of interconnections, the interconnection intervals being discrete; and by specifying an interconnection relating an impermissible width and interconnections relating to an impermissible interval from the interconnections for a semiconductor device based on the interconnection data. The permissible widths and the permissible intervals are preferably equal to or larger than a minimum design dimension.

17 Claims, 6 Drawing Sheets

U.S. PATENT DOCUMENTS

| | | | |
|---|---|---|---|
| 2003/0121018 A1* | 6/2003 | Leung et al. | 716/12 |
| 2003/0177464 A1* | 9/2003 | Takechi et al. | 716/10 |
| 2004/0143806 A1* | 7/2004 | Kodama et al. | 716/5 |
| 2004/0168144 A1* | 8/2004 | Kurose et al. | 716/12 |
| 2004/0199886 A1* | 10/2004 | Liang et al. | 716/5 |
| 2005/0005252 A1* | 1/2005 | Kodama et al. | 716/5 |
| 2005/0138592 A1* | 6/2005 | Morgan et al. | 716/12 |
| 2005/0172252 A1* | 8/2005 | Cheng et al. | 716/10 |
| 2006/0080630 A1* | 4/2006 | Lin | 716/11 |
| 2006/0168551 A1* | 7/2006 | Mukuno | 716/5 |
| 2008/0059935 A1* | 3/2008 | Mehrotra et al. | 716/13 |
| 2008/0184187 A1* | 7/2008 | Mehrotra et al. | 716/13 |

OTHER PUBLICATIONS

Wildman et al., "Multi-Objective Optimization of Interconnect Geometry", IEEE Transactions on Very Large Scale Integration (VLSI) Systems, vol. 11, No. 1, Feb. 2003, pp. 15-23.*

* cited by examiner

METHOD OF SEMICONDUCTOR DEVICE AND DESIGN SUPPORTING SYSTEM OF SEMICONDUCTOR DEVICE

BACKGROUND OF THE INVENTION

1. Field of the Invention

The present invention relates to a system and method for designing a semiconductor device. More particularly, the present invention relates to a system and method for designing interconnections for forming a circuit by connecting a large number of elements provided on a semiconductor substrate.

2. Description of the Related Art

A semiconductor device is provided with circuits to achieve desired functions. In order to form the circuits, it is necessary to interconnect a large number of elements such as a transistors formed on a semiconductor substrate with a large number of interconnections. The space between interconnections and the width of each interconnection are not constant and depends on a required operation speed and current capacity, and further depends on a layout of each element formed on the substrate. Supposing that the width of a certain interconnection is W, the width of another interconnection may be "W−w1" (i.e. interconnection with a smaller width) or "W+w2" (i.e. interconnection with a larger width). The same is applied to the interconnection interval. The above-mentioned "w1" and "w2" are expressed by "n times d". Here, "n" is 0 or a positive integer, while "d" is a change unit of the interconnection width and interconnection interval. In the design and manufacturing of semiconductor devices, a minimum dimension unit in which elements and interconnections are allowed to be laid out through a layout tool, a mask pattern data production, a process restriction, and so on. Therefore, the change unit d of the interconnection width and interconnection interval is equal to the minimum dimension unit. That is, free setting is possible with respect to the widths and spaces of interconnections for connecting elements with the minimum dimension unit as the change unit d.

On the other hand, the semiconductor device is manufactured by using photolithography technique. In such a case, it is known that a shape (a finish shape) actually exposed and processed onto a semiconductor substrate is different from a mask due to the effect of a proximity pattern as patterns are miniaturized. For this reason, a mask is not produced by using an interconnection pattern data as a mask pattern data without any change from the interconnection pattern data, but that a mask pattern but is produced through addition of OPC (Optical Proximity Correction). That is, as shown in FIG. 1, it is supposed that an interconnection pattern data is produced for an interconnection group 520 having an interconnection width W and an interconnection interval P, an interconnection group 510 having the interconnection width W−w1 and the interconnection interval P, and an interconnection group 530 having the interconnection width W+w2 and the interconnection interval P. A mask pattern data is not produced by using only the interconnection pattern data shown in FIG. 1, but the mask is produced by correcting the mask pattern data based on an OPC data 550. In FIG. 1, the correction is not carried out to a mask pattern 521 corresponding to the interconnection group 520, in which the interconnection width W is employed as a width on the mask. On the other hand, in the interconnection groups 510 and 530, the mask patterns 511 and 531 are produced to have "W−m1" and "W+m2", respectively, as the actual widths on the mask.

In recent years, miniaturization of the semiconductor device is increasingly advanced. Under such conditions, it is difficult to employ the OPC.

This is because the effect of proximity patterns is greater and the extent of the effect is not proportion to the change in the interconnection width and interconnection interval as patterns become miniaturized. For example, the ratio of a difference between a design value and a finish dimension to a correction value of a mask dimension is called as MEEF (Mask Error Enhancement Factor). That is, when MEEF is x, correction of 1 nm on a mask corresponds to a difference of x nm in the finish dimension. While MEEF is approximately 1 when a pattern having the interconnection width of 1000 nm and the interconnection interval of 1000 nm is exposed, MEEF is increased up to approximately 5 when a pattern having the interconnection width of 100 nm and the interconnection interval 100 nm is exposed. This means that the change of 1 nm in the mask dimension leads to the change of 5 nm in the finish dimension. Moreover, it indicates that 5% (=5 nm/100 nm) has to be permitted as a variation in the interconnection width.

As mentioned above, in the conventional semiconductor device, there is a problem that a deviation of the interconnection width and/or the interconnection interval from a design value increases due to the limit of the OPC so that an expected operation and performance cannot be obtained.

Moreover, a large amount of OPC data is used since the minimum dimension unit is used as an increment unit in the interconnection width and interconnection interval. As a result, the number of processes is increased for setting and verification of the OPC data. In addition, the processing system is made large in scale as well as the increase in processing time, since it is necessary to select a given correction data from the large amount of the OPC data and calculate the dimension in a high accuracy. Furthermore, the OPC data needs to be re-checked each time a manufacturing process condition is changed, causing a situation which is difficult to cope with.

SUMMARY OF THE INVENTION

In an aspect of the present invention, a designing method of a semiconductor device, is achieved by setting interconnection reference data indicating permissible interconnection widths which are discrete, and a permissible interval between adjacent two of interconnections, the interconnection intervals being discrete; and by specifying an interconnection relating an impermissible width and interconnections relating to an impermissible interval from the interconnections for a semiconductor device based on the interconnection data.

Here, the permissible widths and the permissible intervals are preferably equal to or larger than a minimum design dimension.

Also, the designing method may be achieved by further producing an interconnection pattern data for the interconnections.

Also, the designing method may be achieved by further calculating the width of each of the interconnections based on the interconnection pattern data; and detecting whether the calculated width of each of the interconnections is permissible, based on the interconnection reference data.

Also, the specifying may be achieved by specifying an interconnection relating an impermissible width from the detection of the impermissible width. The designing method may be achieved by further correcting the interconnection pattern data based on the specified interconnection.

Also, the designing method may be achieved by further producing a mask pattern data based on the interconnection pattern data and the OPC (Optical Proximity Correction) data.

Also, the designing method may be achieved by further calculating the interval between every adjacent two of the interconnections based on the interconnection pattern data; and detecting whether the calculated interval is permissible, based on the interconnection reference data.

Also, the specifying may be achieved by specifying an interconnection relating an impermissible width and interconnections relating to an impermissible interval from the detection of the impermissible width and the detection of the impermissible interval. The designing method may be achieved by further correcting the interconnection pattern data based on the specified interconnections.

Also, the designing method may be achieved by further producing a mask pattern data based on the interconnection pattern data and the OPC (Optical Proximity Correction) data.

In another aspect of the present invention, a designing supporting system for a semiconductor device, includes a first storage section configured to store an interconnection reference data indicating permissible interconnection widths which are discrete, and a permissible interval between adjacent two of interconnections, the interconnection intervals being discrete; and a specifying section configured to specify an interconnection relating an impermissible width and interconnections relating to an impermissible interval from the interconnections for a semiconductor device based on the interconnection data.

Here, the permissible widths and the permissible intervals may be equal to or larger than a minimum design dimension.

Also, the designing supporting system may further include a second storage section configured to store an interconnection pattern data for the interconnections.

Also, the designing supporting system may further include a first detecting section configured to calculate the width of each of the interconnections based on the interconnection pattern data, and detect whether the calculated width of each of the interconnections is permissible, based on the interconnection reference data.

Also, the specifying section may specify an interconnection relating an impermissible width from the detection of the impermissible width. The designing supporting system may further include a correcting section configured to correct the interconnection pattern data based on the specified interconnection.

Also, the designing supporting system may further include a mask producing section configured to produce a mask pattern data based on the interconnection pattern data and the OPC (Optical Proximity Correction) data.

Also, the designing supporting system may further include a second detecting section configured to calculate the interval between every adjacent two of the interconnections based on the interconnection pattern data, and to detect whether the calculated interval is permissible, based on the interconnection reference data.

Also, the specifying section may specify an interconnection relating an impermissible width and interconnections relating to an impermissible interval from the detection of the impermissible width and the detection of the impermissible interval. The designing supporting system may further include a correcting section configured to correct the interconnection pattern data based on the specified interconnections.

Also, the designing supporting system may further include a mask producing section to produce a mask pattern data based on the interconnection pattern data and the OPC (Optical Proximity Correction) data.

Still another aspect of the present invention relates to a computer-readable software product for realizing a designing method of a semiconductor device. The designing method is achieved by setting interconnection reference data indicating permissible interconnection widths which are discrete, and a permissible interval between adjacent two of interconnections, the interconnection intervals being discrete; and by specifying an interconnection relating an impermissible width and interconnections relating to an impermissible interval from the interconnections for a semiconductor device based on the interconnection data.

Also, the permissible widths and the permissible intervals are preferably equal to or larger than a minimum design dimension.

DESCRIPTION OF THE PREFERRED EMBODIMENTS

Hereinafter, a design supporting system of a semiconductor device of the present invention will be described in detail with reference to the attached drawings.

Figure 1:
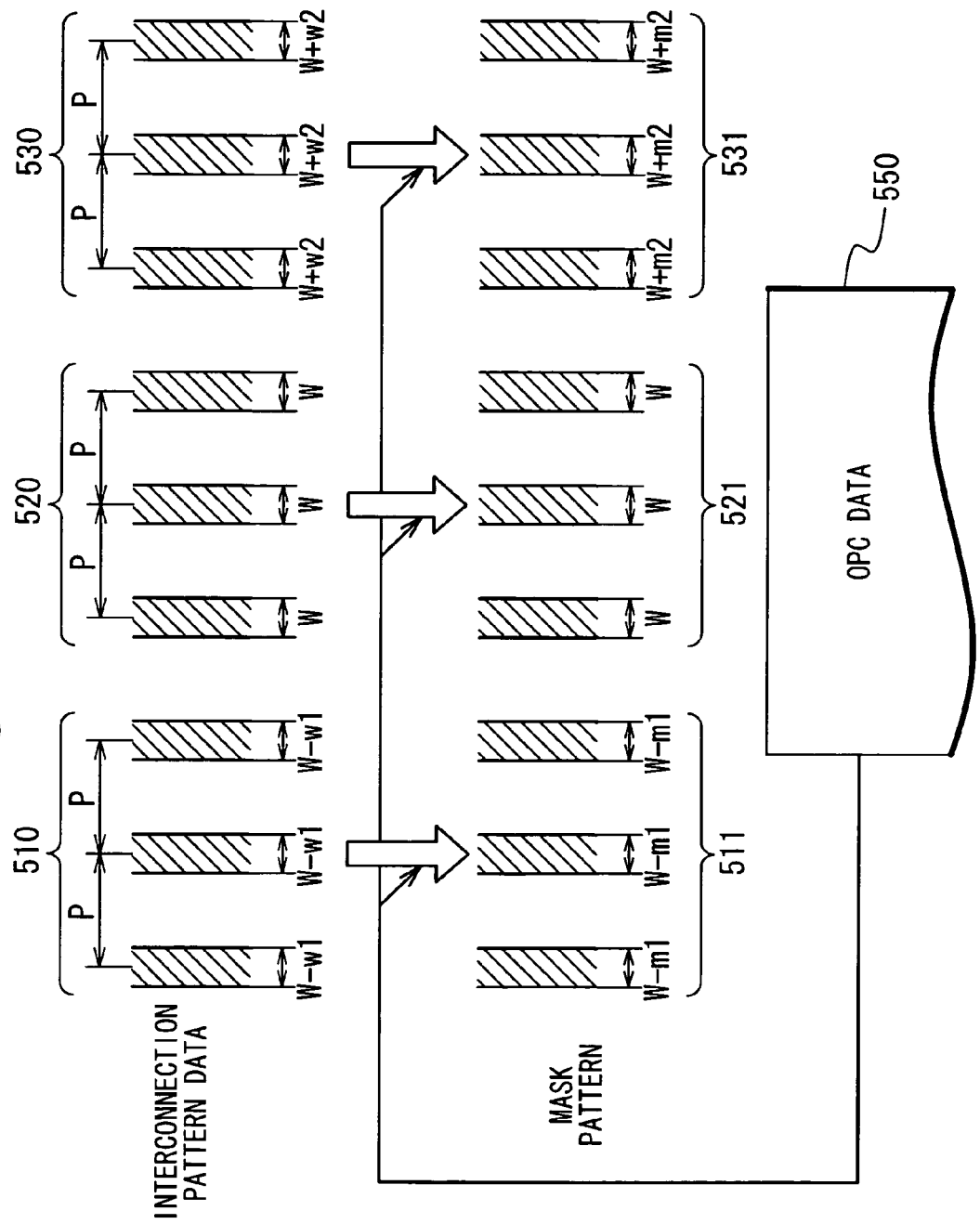
FIG. 1 is a diagram showing interconnection patterns and corresponding mask patterns, in which an OPC process is carried out to a mask pattern.
Figure 2:
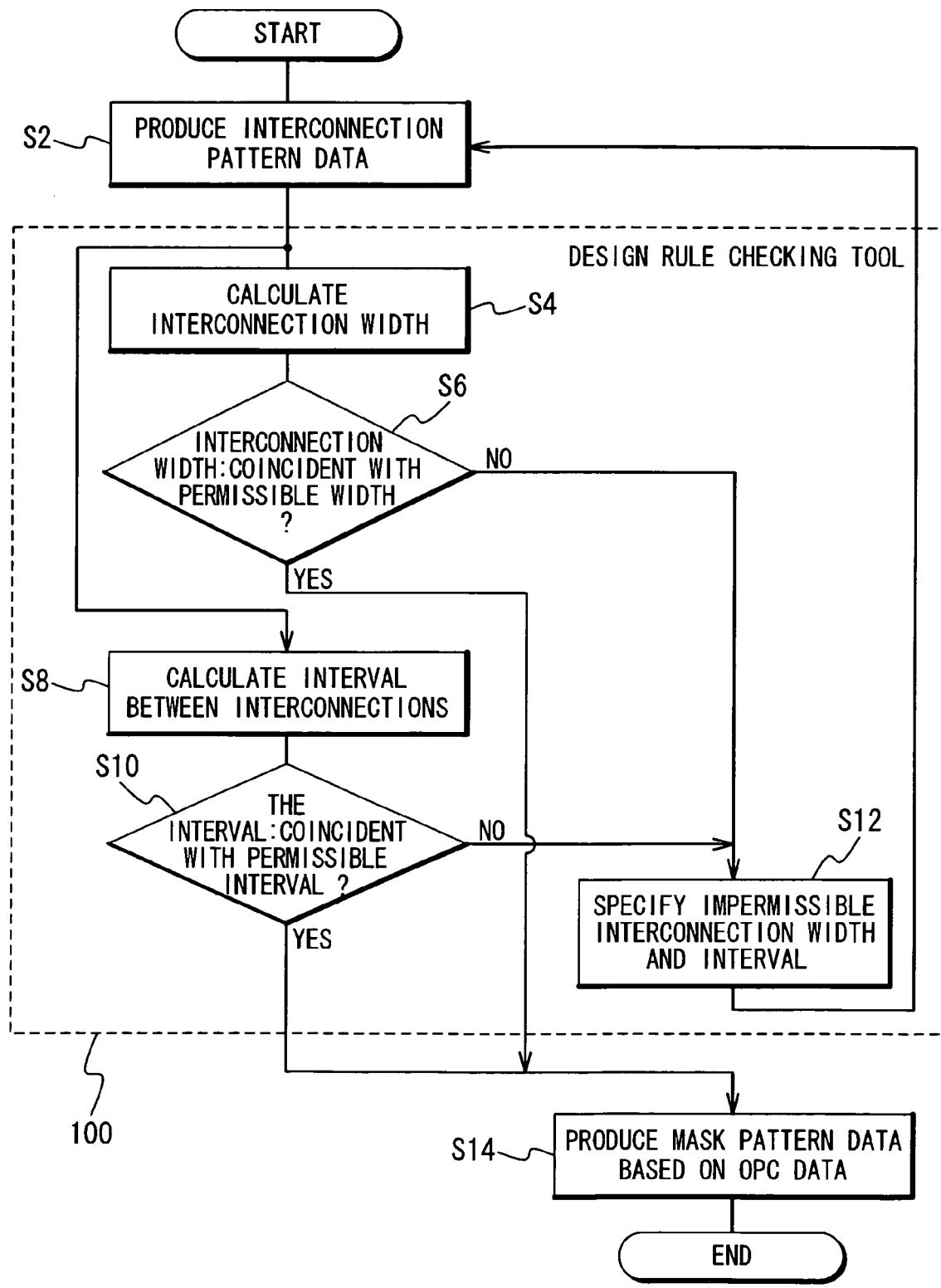
FIG. 2 is a flow chart for showing a principle of the present invention.

With reference to FIG. 2, an interconnection pattern data is produced at step S2 to connect a large number of elements such as transistors formed on a semiconductor substrate. Here, the interconnection pattern data may be for a whole semiconductor chip, or may be produced in units of function blocks, each of which is often referred to as a macro. Additionally, since the wiring is generally realized as a multi-layer structure, the interconnection pattern data is produced for each of layers. The interconnection pattern may be formed by using such s tool as CAD, or directly by those skilled in the art.

The interconnection pattern data is ultimately expressed as a pattern on a mask, namely, as an actual form. The interconnection pattern data has coordinates data of each interconnection, e.g., the coordinates of a start point and end point on a diagonal line of a rectangle under the presumption that each interconnection is the rectangle.

A width of each interconnection is calculated based on the above interconnection pattern data (step 4) and an interval between adjacent interconnections is calculated (step 8). In the present invention, the interconnection width and the interconnection interval cannot be freely changed in units of the minimum dimension size, unlike the conventional example.

The increment unit is specified to be larger than the minimum dimension size and to be discrete. For this reason, the calculated interconnection width and interconnection interval are checked at step 3 and step 5 on whether the calculated interconnection width and interconnection interval are coincident with permissible interconnection width and interconnection interval.

Interconnections with impermissible widths and intervals are specified based on the above determination results (step 6). The result at step 6 is fed back to a designer of the interconnection pattern, and the interconnection width and/or the interconnection interval determined to be impermissible are corrected.

On the other hand, when no impermissible interconnection is found, the interconnection pattern passes the step 6 and a mask pattern data is produced based on an OPC data (step 7).

The above steps 2 to 6 are executed by a computer as a design-rule checking tool 100.

Figure 3:
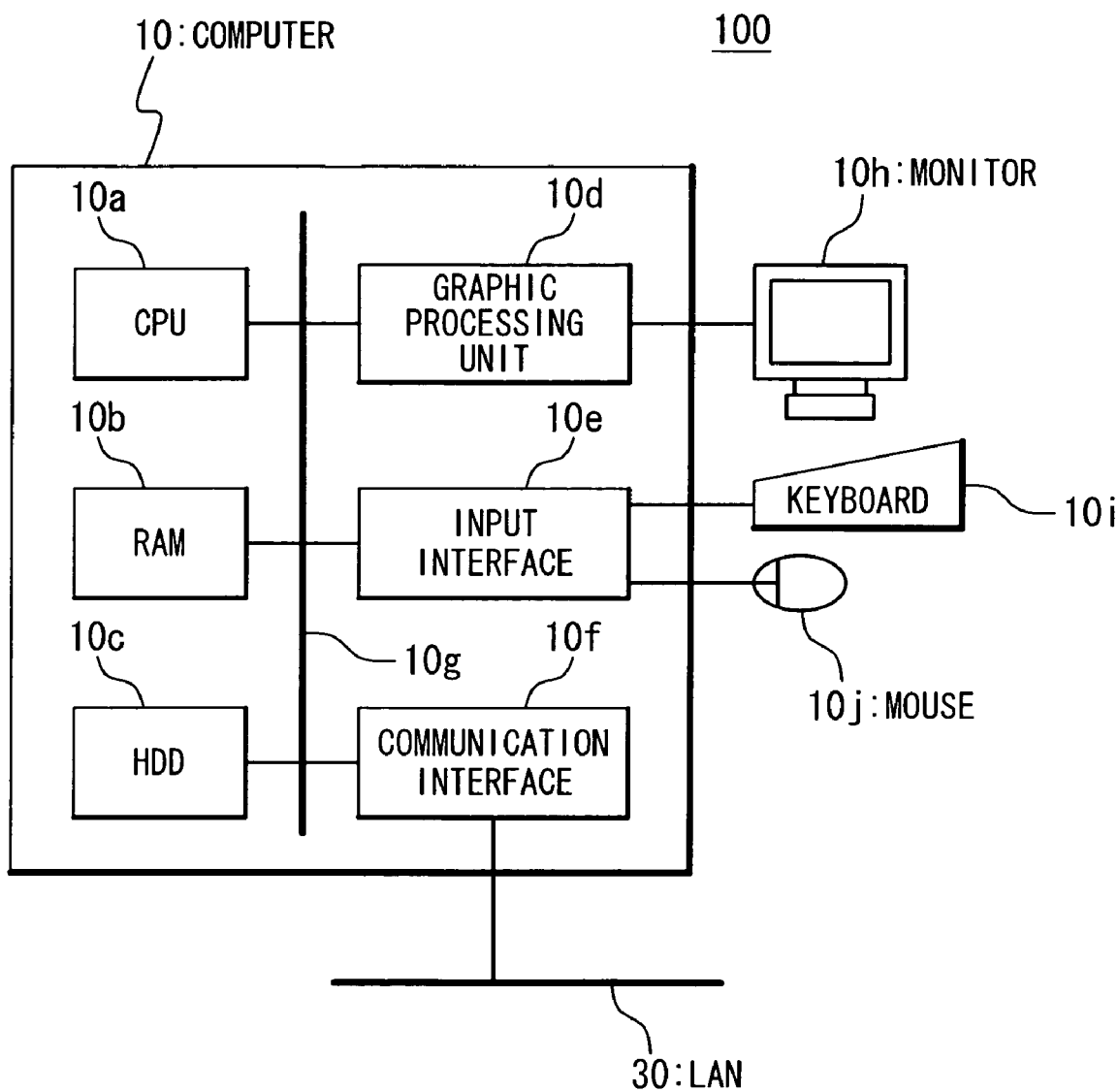
FIG. 3 is a block diagram showing configuration of a computer as a design supporting system of the present invention.

With reference to FIG. 3, a computer 10 has a CPU (Central Processing Unit) 10*a* for controlling the whole device. A RAM (Random Access Memory) 10*b*, an HDD (Hard Disk Drive) 10*c*, a graphic processing unit 10*d*, an input interface 10*e*, and a communication interface 10*f* are connected to the CPU 10*a* through a bus 10*g*.

The RAM 10*b* temporarily stores at least a part of an OS (Operating System) for operating the CPU 10*a* and an application program for designing a semiconductor device. The RAM 10*b* also temporarily stores data. On the other hand, the HDD 10*c* stores the OS and the application program. Further, according to the present invention, data of interconnection widths and interconnection intervals permissible in interconnection design are stored.

The graphic processing unit 10*d* is connected to a monitor 10*h*. An image is displayed on the monitor 10*h* in accordance with a command from the CPU 10*a* or the like. The input interface 10*e* is connected to a keyboard 10*i* and a mouse 10*j*, and transfers signals from the keyboard 10*a* and the mouse 10*j* to the bus 10*g*.

The communication interface 10*f* is connected to other computers (not shown) and performs data communication with those computers through a LAN 30.

Figure 4:
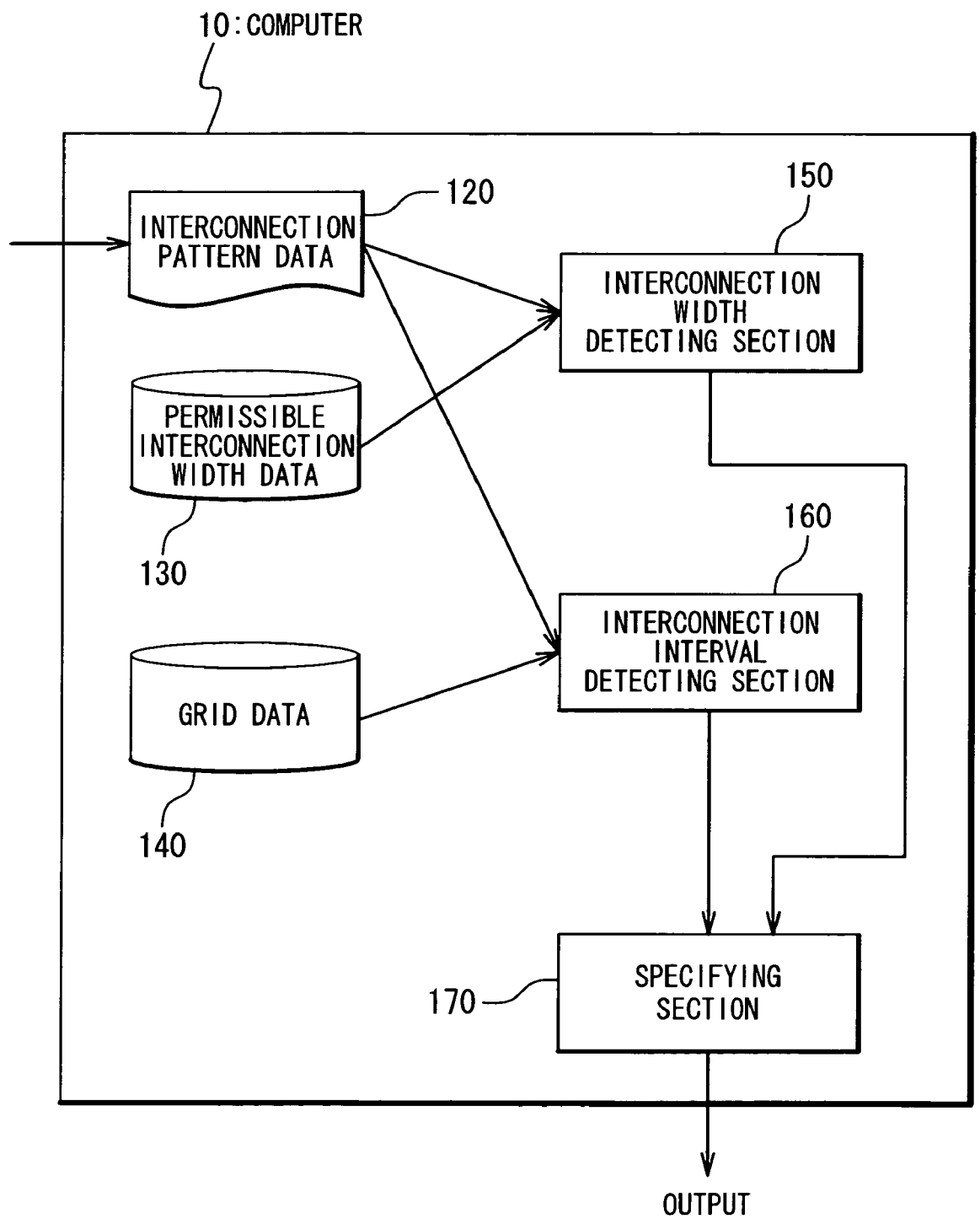
FIG. 4 is a function block diagram of the computer.

Through the hardware configuration as mentioned above, the design method for semiconductor devices of the present invention can be realized. The operation of the design supporting system according to the present invention will be described with reference to FIG. 4.

In this embodiment, an interconnection pattern data is produced through the use of a CAD tool (not shown) other than the computer 100. The interconnection pattern data is stored into the HDD 10*c* through the LAN 30 as an interconnection pattern data 120. Needless to say, it is also possible to directly produce an interconnection pattern data by executing an interconnection pattern generating program in the computer 10 and using the keyboard 10*i*, the mouse 10*j*, the input interface, and a graphic processing function provided to the computer 10.

In the HDD, the data of the interconnection widths and interconnection interval permissible in the interconnection design are stored as mentioned above.

In this embodiment, the following eight kinds are permitted as the interconnection widths: 100 nm, 200 nm, 300 nm, 400 nm, 500 nm, 600 nm, 700 nm, and 800 nm. Among the eight kinds, 100 nm is a minimum interconnection width on a mask pattern. Also, 100 nm means a minimum interconnection interval. The above data are stored in the HDD 10*c* as the permissible interconnection width data 130. On the other hand, with respect to the interconnection interval, the minimum interconnection interval is 100 nm and a permissible increment unit is 50 nm. That is to say, the interconnection intervals of 100 nm, 150 nm, 200 nm, 250 nm, and so on are permitted. The above interconnection interval data may be stored in the HDD 10*c*. In the embodiment, however, the interconnection interval data is stored as grid data 140 having the intervals of 50 by 50 nm, in order to easily determine impermissible interconnection intervals.

Figure 5:
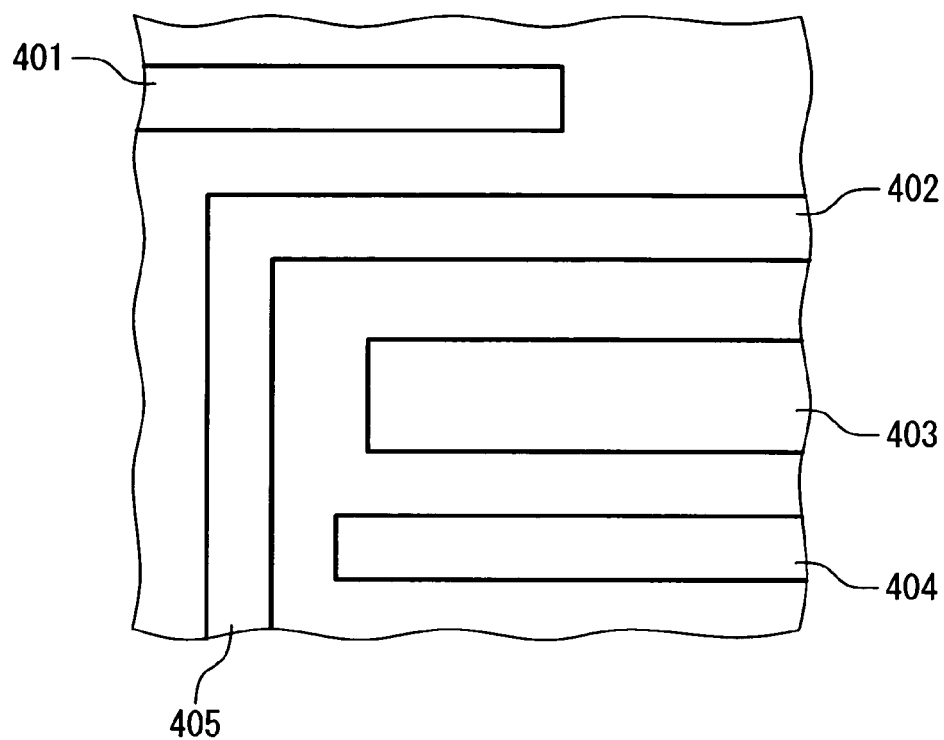
FIG. 5 is a plan view showing interconnection patterns as one example.

Through the use of the interconnection pattern data 120 and the allowed interconnection width information 130, the width of each interconnection is verified by an interconnection width detecting section 150. Since each interconnection has coordinates at start and end points of a single diagonal line of a rectangular shape as mentioned above, the interconnection width is easily obtained from the coordinates. It is assumed that an interconnection pattern to be verified is as shown in FIG. 5 and five interconnections 401 to 405 are shown. Here, the interconnections 402 and 405 are continuous although the interconnections 402 and 405 extend in the directions different from each other. In the example shown in FIG. 5, interconnection widths of the interconnections 401 to 404 are calculated from the respective Y coordinates while the interconnection width of the interconnection 405 is obtained from the X coordinates. The width of each interconnection is verified by checking whether it is coincident with any one of the eight allowed interconnection widths. In the example, it is assumed that the interconnection widths are designed to be 100 nm for the interconnections 401, 402, 404, and 405, and 175 nm for the interconnection 403. As a result, the interconnection 403 is detected to be an impermissible interconnection from the design rules.

Figure 6:
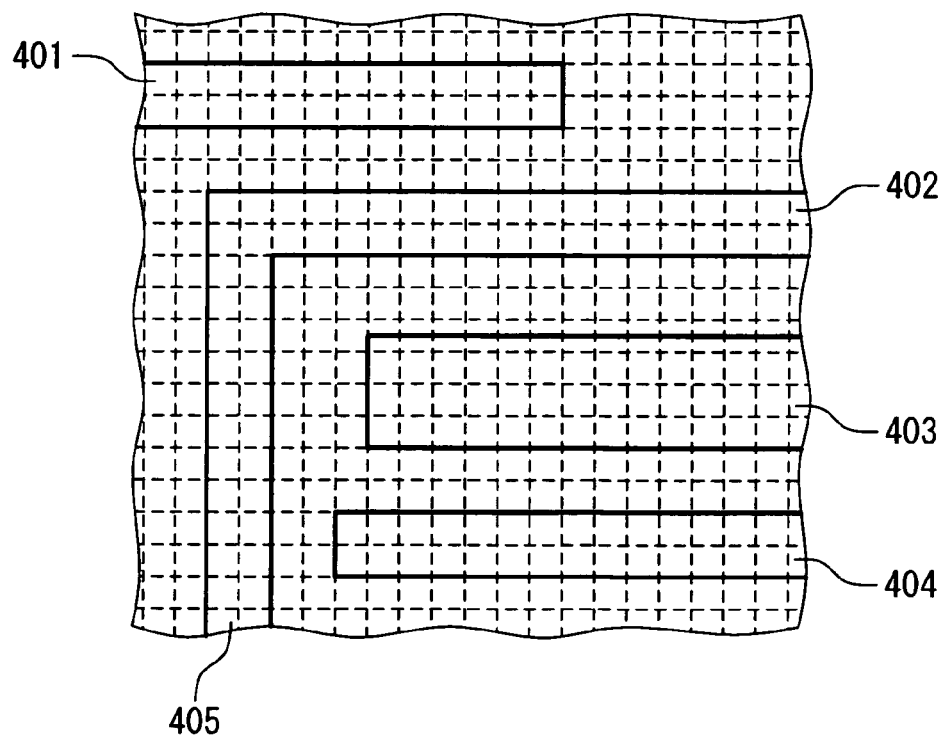
FIG. 6 is a plan view showing relationship between the interconnection patterns and a grid for verifying interconnection intervals.

As for the interconnection interval, an interval between adjacent interconnections is verified by an interconnection width detecting section 160 through the use of the interconnection pattern data 120 and the grid data 140. In this embodiment, the grid data is as shown in FIG. 6 since the increment unit of 50 nm is permitted with the minimum interconnection interval of 100 nm. In FIG. 6, a grid with dotted lines having the intervals of 50 by 50 nm is defined. Then, it is verified whether each of the coordinates of the interconnections 401 to 405 is located on any one of grid lines passing through grids, and whether at least one grid line exists between the coordinates of the interconnections.

The situation when the grid data is applied to the interconnection pattern shown in FIG. 5 is shown in FIG. 6. As understood from FIG. 6, one side of the interconnection 403 nearest to the interconnection 402 is not located on a grid line. As a result, it is detected that the interval between the interconnections 402 and 403 is against the design rules.

A specifying section 170 specifies and outputs impermissible interconnections and interconnection intervals based on data from the interconnection width detecting section 150 and the interconnection interval detecting section 160. In this embodiment, an output of the specifying section 170 is sent to a computer (not shown) for managing display control through the LAN 30, but may be displayed through the use of the graphic processing unit 10*d* and the monitor 10*h* provided to the computer 10.

Figure 7:
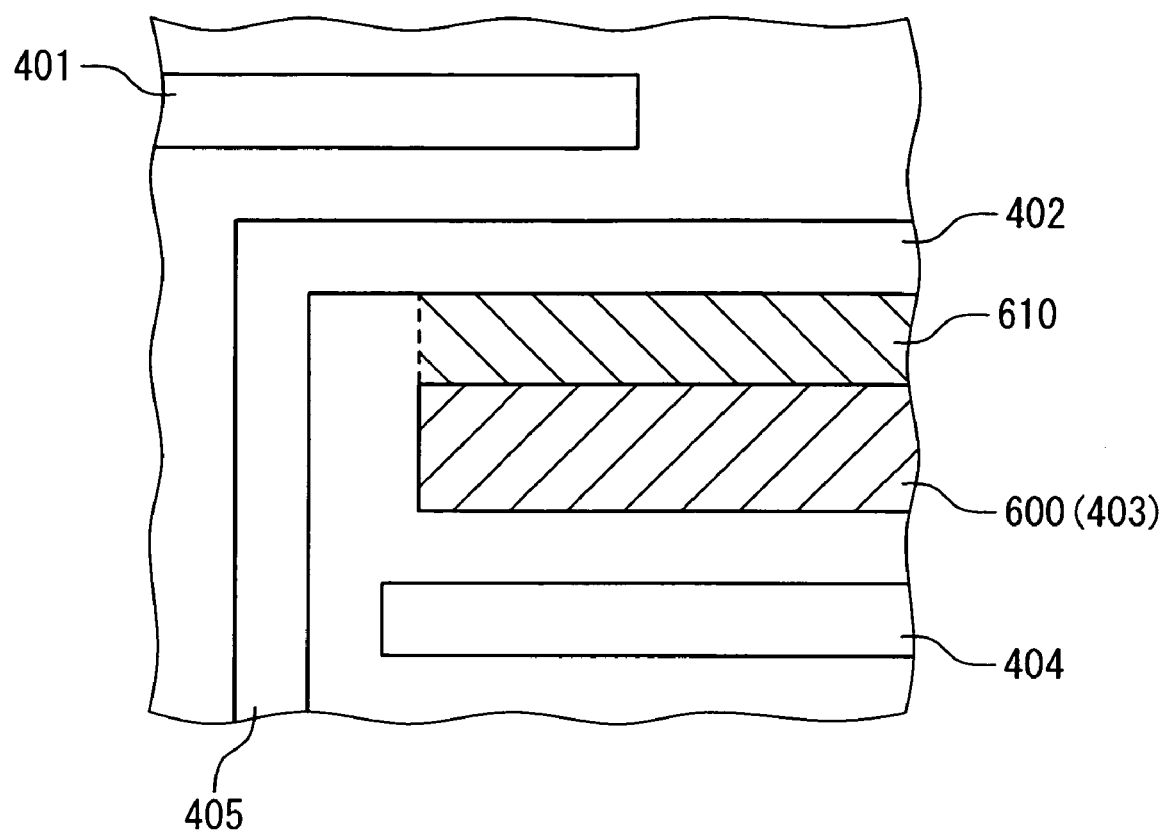
FIG. 7 is a plan view showing a display example in which an impermissible interconnection width and an impermissible interconnection interval are specified.

In a display mode in this embodiment, the impermissible interconnection 403 and the impermissible interconnection interval are shown in an oblique-line display 600 and a colored display 610, as shown in FIG. 7. Alternatively, the coordinates data of the interconnection 403 may be colored differently from other coordinates data in the interconnection pattern, and the coordinates data of the interconnections 402 and 403 may be attached with marks at the ends in the interconnection interval.

The data specifying the impermissible interconnection widths and interconnection intervals are fed back to a designer of the interconnection pattern, so as to request any correction to the interconnection pattern data. The corrected interconnection pattern data or the interconnection pattern data containing no impermissible interconnection width and interval are transferred to a mask pattern producing step, where a mask pattern is generated by applying correction based on OPC data. At this time, the OPC data is based on the permissible interconnection widths and interconnection intervals. Therefore, preparation and verification of the OPC data is much easier compared with the conventional example. In addition, it is possible to promptly cope with a change of manufacturing process conditions and so on.

In this way, an interconnection width of each interconnection and an interconnection interval between adjacent interconnections in an interconnection pattern are verified through the use of a computer in the above-mentioned manner. That is to say, a produced interconnection pattern data is loaded, and first data indicating discretely permissible interconnection widths and second data indicating discretely permissible interconnection intervals are read out. Then, interconnections with impermissible interconnection widths and/or intervals in the interconnection pattern are specified based on the interconnection pattern data, the first data, and the second data.

Such processing may be provided as a design program. Also, a design device in which such a program is installed may be provided.

According to the present invention, limits are set on interconnection widths and interconnection intervals used in designing, and values of the interconnection widths and interconnection intervals are discrete. Therefore, only a small amount of OPC data needs to be produced. Thus, prompt response is possible even when manufacturing processes are changed.

It would be obvious that various modifications may be made to the present invention without being apart from the scope of the present invention, in addition to the above embodiments.

What is claimed is:

1. A designing method of a semiconductor device, comprising:
    setting interconnection reference data indicating permissible interconnection widths and permissible intervals between adjacent two of interconnections; and
    specifying an interconnection relating an impermissible width and interconnections relating to an inpermissible interval from said interconnections for a semiconductor device based on said interconnection data;
    wherein:
    a first difference between any two of the permissible interconnection widths equals to n times a first increment unit;
    a second difference between any two of the permissible intervals equals to m times a second increment unit;
    m and n are independently selected integers; and
    the first and second increment units are larger than a minimum design dimension.

2. The designing method according to claim 1, further comprising:
    producing an interconnection pattern data for said interconnections.

3. The designing method according to claim 2, further comprising:
    calculating the width of each of said interconnections based on said interconnection pattern data; and
    detecting whether the calculated width of each of said interconnections is permissible, based on said interconnection reference data.

4. The designing method according to claim 3, wherein said specifying comprises:
    specifying an interconnection relating an impermissible width from the detection of said impermissible width, and
    said designing method further comprises:
    correcting said interconnection pattern data based on the specified interconnection.

5. The designing method according to claim 3, further comprising:
    producing a mask pattern data based on said interconnection pattern data and OPC (Optical Proximity Correction) data.

6. The designing method according to claim 3, further comprising:
    calculating the interval between every adjacent two of said interconnections based on said interconnection pattern data; and
    detecting whether the calculated interval is permissible, based on said interconnection reference data.

7. The designing method according to claim 6, wherein said specifying comprises:
    specifying an interconnection relating an impermissible width and interconnections relating to an impermissible interval from the detection of said impermissible width and the detection of said impermissible interval, and
    said designing method further comprises:
    correcting said interconnection pattern data based on the specified interconnections.

8. The designing method according to claim 6, further comprising:
    producing a mask pattern data based on said interconnection pattern data and OPC (Optical Proximity Correction) data.

9. A designing supporting system for a semiconductor device, comprising:
    a first storage section configured to store an interconnection reference data indicating permissible interconnection widths and permissible intervals between adjacent two of interconnections; and
    a specifying section configured to specify an interconnection relating an impermissible width and interconnections relating to an impermissible interval from said interconnections for a semiconductor device based on said interconnection data;
    wherein:
    a first difference between any two of the permissible interconnection widths equals to n times a first increment unit;
    a second difference between any two of the permissible intervals equals to m times a second increment unit;
    m and n are independently selected integers; and
    the first and second increment units are larger than a minimum design dimension.

10. The designing supporting system according to claim 9, further comprising:
    a second storage section configured to store an interconnection pattern data for said interconnections.

11. The designing supporting system according to claim 10, further comprising:
    a first detecting section configured to calculate the width of each of said interconnections based on said interconnection pattern data, and detect whether the calculated width of each of said interconnections is permissible, based on said interconnection reference data.

12. The designing supporting system according to claim 11, wherein said specifying section specifies an interconnection relating an impermissible width from the detection of said impermissible width, and said designing supporting system further comprises:

a correcting section configured to correct said interconnection pattern data based on the specified interconnection.

13. The designing supporting system according to claim 11, further comprising:

a mask producing section configured to produce a mask pattern data based on interconnection pattern data and said OPC (Optical Proximity Correction) data.

14. The designing supporting system according to claim 11, further comprising:

a second detecting section configured to calculate the interval between every adjacent two of said interconnections based on said interconnection pattern data, and to detect whether the calculated interval is permissible, based on said interconnection reference data.

15. The designing supporting system according to claim 14, wherein said specifying section specifies an interconnection relating an impermissible width and interconnections relating to an impermissible interval from the detection of said impermissible width and the detection of said impermissible interval, and said designing supporting system further comprises:

a correcting section configured to correct said interconnection pattern data based on the specified interconnections.

16. The designing supporting system according to claim 14, further comprising:

a mask producing section to produce a mask pattern data based on said interconnection pattern data and OPC (Optical Proximity Correction) data.

17. One or more computer-readable medium comprising computer-readable instructions, when executed by a computer cause the computer to realize a designing method of a semiconductor device, wherein said designing method comprises:

setting interconnection reference data indicating permissible interconnection widths and permissible intervals between adjacent two of interconnections; and specifying an interconnection relating an impermissible width and interconnections relating to an impermissible interval from said interconnections for a semiconductor device based on said interconnection data;

wherein:

a first difference between any two of the permissible interconnection widths equals to n times a first increment unit;

a second difference between any two of the permissible intervals equals to m times a second increment unit;

m and n are independently selected integers; and the first and second increment units are larger than a minimum design dimension.

* * * * *